United States Patent [19]

Choate et al.

[11] Patent Number: 5,323,103
[45] Date of Patent: Jun. 21, 1994

[54] FREQUENCY MEASUREMENT RECEIVER WITH MEANS TO RESOLVE TWO FOLDING FREQUENCIES OF COMPLEX SIGNALS

[75] Inventors: David B. Choate, Salvisa, Ky.; James B. Y. Tsui, Dayton, Ohio

[73] Assignee: The United States of America as represented by the Secretary of the Air Force, Washington, D.C.

[21] Appl. No.: 37,854

[22] Filed: Mar. 29, 1993

[51] Int. Cl.$^5$ .............................................. G01R 23/16
[52] U.S. Cl. .............................. 324/76.22; 324/76.35; 324/76.21; 342/20; 342/13; 364/484
[58] Field of Search ..................... 342/14, 15, 20, 13; 364/484; 324/76.22, 76.21, 76.24, 76.23

[56] References Cited

U.S. PATENT DOCUMENTS

| | | |
|---|---|---|
| 2,989,744 | 6/1961 | Pettit . |
| 3,913,099 | 10/1975 | Wehner et al. . |
| 4,359,735 | 11/1982 | Lewis et al. . |
| 4,504,785 | 3/1985 | Tucker ............................ 324/76.35 |
| 4,612,545 | 9/1986 | Asendorf ............................. 342/20 |
| 4,816,832 | 3/1989 | Gold et al. . |
| 4,866,449 | 9/1989 | Gaffney . |
| 4,893,266 | 1/1990 | Deem ................................. 364/484 |
| 4,951,219 | 8/1990 | Zimmer ............................ 324/76.35 |
| 4,963,816 | 10/1990 | Tsui et al. . |
| 5,077,562 | 12/1991 | Chang et al. . |
| 5,099,194 | 3/1992 | Sanderso;n et al. . |
| 5,099,243 | 3/1992 | Tsui et al. . |
| 5,109,188 | 4/1992 | Sanderson et al. . |
| 5,198,748 | 3/1993 | Tsui ................................. 324/76.35 |
| 5,235,287 | 8/1993 | Sanderson ....................... 324/76.35 |

*Primary Examiner*—Kenneth A. Wieder
*Assistant Examiner*—Jose M. Solis
*Attorney, Agent, or Firm*—Bernard E. Franz; Thomas L. Kundert

[57] ABSTRACT

This is an arrangement to find two folding frequencies that fold into one frequency bin, which will save hardware. The input frequency in down converted into I and Q channels. Each channel requires one pair (two) of A/D converters. A total of three pairs of A/D converters are required. All three pairs of A/D converters have the SAME sampling frequency $f_s$. There is a time delay of $\tau$ before the second pair of A/D converters, and $2\tau$ before the third pair. At the outputs of the A/D converters FFT units followed by a signal processor are used to find the input frequencies by solving non-linear simultaneous equations.

2 Claims, 1 Drawing Sheet

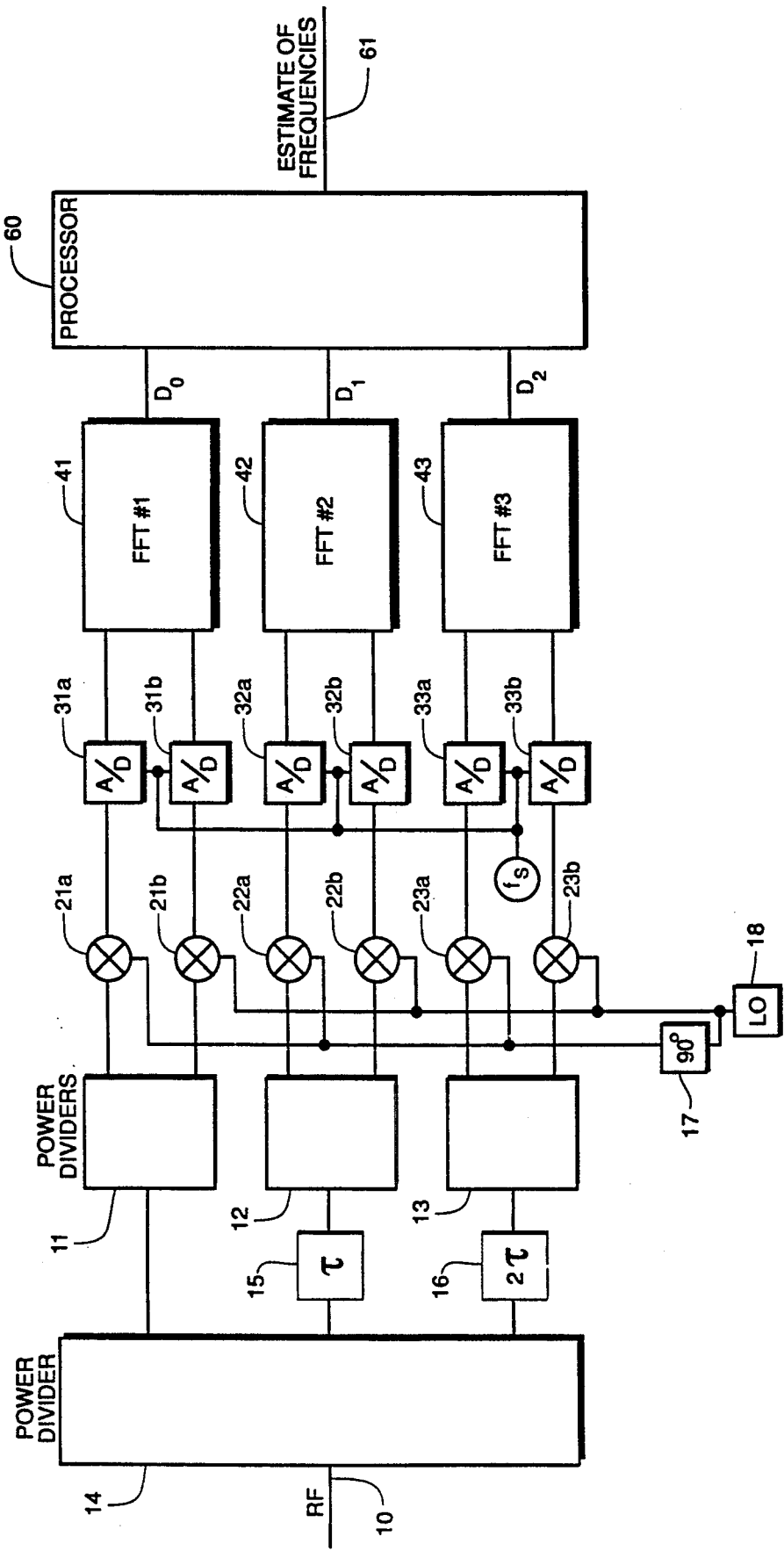

FREQUENCY MEASUREMENT RECEIVER WITH MEANS TO RESOLVE TWO FOLDING FREQUENCIES OF COMPLEX SIGNALS

RIGHTS OF THE GOVERNMENT

The invention described herein may be manufactured and used by or for the Government of the United States for all governmental purposes without the payment of any royalty.

BACKGROUND OF THE INVENTION

The present invention relates generally to a digital frequency measurement receiver with means to resolve an ambiguity in multiple frequency estimation, and more particularly to means to resolve two folding frequencies of complex signals.

The following U.S. patents are of interest. U.S. Pat. No. 4,963,816-Tsui et al U.S. Pat. No. 5,099,194-Sanderson et al U.S. Pat. No. 5,099,243-Tsui et al U.S. Pat. No. 5,109,188-Sanderson et al U.S. Pat. No. 2,989,744-Pettit U.S. Pat. No. 3,913,099-Wehner et al U.S. Pat. No. 4,359,735-Lewis et al U.S. Pat. No. 4,816,832-Gold et al U.S. Pat. No. 4,866,449-Gaffney U.S. Pat. No. 5,077,562-Chang et al.

Tsui et al in U.S. Pat. No. 4,963,816 disclose an Instantaneous Frequency Measurement receiver having two delay lines wherein frequency resolution is based on the Chinese Remainder Theorem. The theorem states that if an unknown number X is divided by a number a with a remainder $r_1$ and also divided by a number b with a remainder $r_2$, where a and b are relatively prime numbers, the number X can be determined uniquely from a, b, $r_1$ and $r_2$ if X<ab. For example, if a=5, b=7, $r_1$=2 and $r_2$=1, the Chinese remainder gives an X of 22.

Sanderson et al in U.S. Pat. No. 5,099,194 disclose a digital frequency measurement receiver with bandwidth improvement through multiple sampling of real signals. Two sets of uniform samples are used with slightly different sampling frequency, wherein each set is Fourier transformed independently and the frequency of the lowest aliases determined. Unambiguous determination of the signal frequency over a range far exceeding the Nyquist frequency is obtained except at a discrete set of points. Tsui et al in U.S. Pat. No. 5,099,243 disclose a technique for extending the frequency range of a digital frequency measurement receiver, through multiple sampling of complex signals, which employs in-phase and quadrature components of the signal coupled with non-uniform sampling. Each set of complex samples is independently Fourier transformed, and the frequency of the lowest aliases permits unambiguous determination of the signal frequency over a range far exceeding the Nyquist frequency.

Sanderson et al in U.S. Pat. No. 5,109,188 disclose a technique for extending the frequency range of an instantaneous frequency measurement receiver, wherein a power divider is employed with two outputs. One output is supplied to a first A/D converter, and the other output is supplied via a delay device to a second A/D converter. A processor 60 receives the outputs of the two A/D converters 42, 44. The input signal is subjected to a known delay τ and both original and delayed signals are sampled simultaneously and Fourier transformed and both the phase and amplitudes calculated.

The Pettit U.S. Pat. No. 2,989,744 describes a false echo transmitter wherein pulses from an enemy radar are delayed in time by a suitable interval and utilized to activate a local transmitter which emits delayed radio pulses and thus to confuse the enemy.

Gold et al U.S. Pat. No. 4,816,832 discloses a continuous repeater target denial device having a receiver 12, RF filters, and transmitter 14. Lines 30 respectively carry a different local oscillator frequency which is of the same order of magnitude as the received radar burst frequency. A recirculation loop 48, a delay device 66, a control circuit 70, and other circuit elements are disclosed. A plurality of filters is provided, each one of them passing the frequency band of the enemy radar signal, so a corresponding one of a plurality of local oscillator frequencies that are all continuously generated can be used to mix with the received signal for circulating in an IF loop. A differential time delay assures that the appropriate local oscillator frequency arrives at the loop down converter prior to or at the same time as the signal. The apparatus also includes an amplitude and doppler offset modulation means to control the signature of the synthetic target stream.

Gaffney U.S. Pat. No. 4,866,449 discloses a multichannel alignment processor for signals modulated onto a common IF frequency for a monopulse radar. A/D and baseboard converter circuits 28, 32, 36 and 40 respond to clock signals from generator 42. Digital signals are produced representing the I and Q components of the corresopnding baseband signals. Alternate circuitry is disclosed.

Chang et al U.S. Pat. No. 5,077,562 discloses a digital beam-forming technique using temporary noise injection using relatively few small-scale A/D converters wherein the IF input signal is separated into baseboard in-phase and quadrature-phase components by an I/Q split network.

The remaining patent references are included for general background information.

SUMMARY OF THE INVENTION

An objective of the invention is to provide an arrangement to find two folding frequencies that fold into one frequency bin, which will save hardware.

This invention relates to an arrangement to find two frequencies by solving non-linear simultaneous equations.

According to the invention, the input frequency in down converted into I and Q channels. Each channel requires one pair (two) of A/D converters. A total of three pairs of A/D converters are required. All three pairs of A/D converters have the SAME sampling frequency $f_s$. There is a time delay of τ before the second pair of A/D converters, and 2τ before the third pair. At the outputs of the A/D converters FFT processors are used to find the input frequency.

BRIEF DESCRIPTION OF THE DRAWING

The single FIGURE is a block diagram showing a configuration according to the invention.

DETAILED DESCRIPTION

A description of this invention was accepted on Dec. 23, 1992, with an anticipated publication date in April, 1993 by THE INSTITUTION OF ELECTRICAL ENGINEERS , Michael Faraday House, Six Hills Way, Stevenage, Herts, SG1 2AY, United Kingdom.

In a digital frequency measurement receiver, the incident signals are mixed with signals from a local oscillator and downconverted to an intermediate frequency (IF). This IF is sampled and further processed using Fast Fourier Transform (FFT) to find the frequencies of the input signals. The range of the input frequency can be increased beyond the Nyquist rate through phase comparison method as discussed in the Sanderson and Tsui U.S. Pat. No. 5,109,188 titled "Instantaneous Frequency Measurement Receiver with Bandwidth Improvement Through Phase Shifted Sampling of Real Signals". In the arrangement disclosed in that patent, two signals can usually be identified. However, under certain frequency input conditions, two signals may fold into one frequency bin and the correct phase cannot be found anymore, thus, the frequency measurement will be erroneous.

In order to measure the frequencies of two signals under any condition, an arrangement is disclosed in a copending patent application Ser. No. 07/997,262, filed Dec. 24, 1992, now U.S. Pat. No. 5,293,114, by McCormick and Tsui for a "Frequency Measurement Receiver with Means to Resolve an Ambiguity in Multiple Frequency Estimation", when configured to resolve two frequencies, uses three FFT units, each having a pair of Analog-to-Digital converters (A/Ds) for a total of six Analog-to-Digital Converters, and each pair operates at a different sampling frequency. According to the present inventio, all six A/D converters have the same operation frequency, thus, the system design is less complicated.

U.S. Pat. No. 5,099,243 by Tsui and Sanderson, for a "Digital Frequency Measurement Receiver with Bandwidth Improvement Through Multiple Sampling of Complex Signals" covers a technique which employs in phase (I) and quadrature (Q), with two A/D converters for each component using two sampling frequencies. The invention herein can be considered as an extension thereof. In this approach the input frequency is down converted into I and Q channels. Each channel requires one pair (two) A/D converters. A total of three pairs of A/D converters are required as shown in FIG. 1. All three pairs of A/D converters have the SAME sampling frequency $f_s$. There is a time delay of $\tau$ between the three pairs of A/D converters. At the outputs of the A/D converters FFT processors are used to find the input frequency.

The drawing illustrates a version of a configuration according to the invention. In the FIGURE, an input of up to three frequencies is fed into three FFT units 41-43 operating at a single sampling frequency $f_s$. The input to the FFT units is considered as complex. The outputs of the FFT units 41-43 are coupled to a unit 60 which performs a multiple frequency ambiguity resolution algorithm. The output of unit 60 on line 61 provides an estimate of the frequencies. Each of the FFT units 41-43 will operate on N points (e.g., N=128).

The input is shown with an RF input on line 10 coupled via power divider apparatus 14 and power dividers 11-13 to six mixers 21a-23b. A time delay unit 15 providing a delay $\tau$ is coupled between the power dividers 14 and 12, and a time delay unit 16 providing a delay $2\tau$ is coupled between the power dividers 14 and 13. Signals from a local oscillator 17 are supplied directly to the three mixers 21b-23b to provide in-phase signals, and via a 90° circuit 17 to the three mixers 21a-23a to provide quadrature signals. All of the A/D converters operate at the same sampling frequency $f_s$. The outputs of the first pair of mixers 21a and 21b are coupled via respective analog-to-digital converters 31a and 31b to provide complex digital input signals to the first FFT unit 41. In like manner the other FFT units 42-43 have inputs via pairs of mixers and pairs of A/D converters. Note that the input at line 10 may have simultaneous pulse signals with up to three frequencies, which are coupled as complex signals to each of the three FFT units. The peak outputs of the FFT units 41-43 are designated as $D_0$, $D_1$ and $D_2$ respectively.

In general, only two pairs of A/D converters are required to find the input frequencies of two or more signals, if all the alias frequencies are folded into different frequency bins. If the input signals are separated by $nf_s$ where n is an integer, two pairs of A/D converters cannot properly solve the input frequency. Under this condition, the third pair of A/D converters is required to solve for the input frequency.

Under this special condition, when two input frequencies ($f_1$ and $f_2$) are folded into one frequency bin, the output from the three peak outputs from the FFT can be written as:

$$D_0 = c_1 + c_2 \tag{1a}$$
$$D_1 = c_1 e^{-j\theta_1} + c_2 e^{-j\theta_2} \tag{1b}$$
$$D_2 = c_1 e^{-j2\theta_1} + c_2 e^{-j2\theta_2} \tag{1c}$$

where c's are nonzero complex numbers and the $\theta$'s are real and they represent the input signals. Both are unknown. The $\theta$'s are functions of the input signal frequencies and the delay factors in the delay units 15 and 16 as ($\theta_1 = 2\pi f_1 \tau$) and ($\theta_2 = 2\pi f_2 \tau$). The D's are complex numbers obtained from the Fast Fourier Transform of the peak outputs of the amplitude data. When there is only one signal ($c_2 = 0$), all the D's have the same amplitude. When two signals are folded into one frequency bin, the amplitudes of D's are different. Using this criterion, one can determine whether there is one signal or two signals.

If there are two signals folding into one frequency bin, the following method can be used to solve them. Set $x = e^{-j\theta_1}$ and $y = e^{-j\theta_2}$ and assume that $x \neq y$. Equation (1) can be written as $$\begin{bmatrix} 1 & 1 \\ x & y \\ x^2 & y^2 \end{bmatrix} \begin{bmatrix} c_1 \\ c_2 \end{bmatrix} = \begin{bmatrix} D_0 \\ D_1 \\ D_2 \end{bmatrix} \tag{2}$$

which in turn is equivalent to $$\begin{bmatrix} 1 & 1 & 1 \\ x & y & 0 \\ x^2 & y^2 & 0 \end{bmatrix} \begin{bmatrix} c_1 \\ c_2 \\ 0 \end{bmatrix} = \begin{bmatrix} D_0 \\ D_1 \\ D_2 \end{bmatrix} \tag{3}$$

(Note that the 1 we have added to the 1×3 position can be replaced by any nonzero constant without changing the sequel.)

Since $x \neq y$, the inverse of the coefficient matrix of (3) is $$\begin{bmatrix} 0 & -y/(x^2 - xy) & 1/(x^2 - xy) \\ 0 & (x^2/y)/(x^2 - xy) & (-x/y)/(x^2 - xy) \\ 1 & [y - (x^2/y)]/(x^2 - xy) & -[1 - (x/y)]/(x^2 - xy) \end{bmatrix} \tag{4}$$

After solving the system we obtain $$c_1 = [-y/(x^2-xy)]D_1 + [1/(x^2-xy)]D_2 \qquad (5a)$$

$$c_2 = [(x^2/y)/(x^2-xy)]D_1 + [(-x/y)/(x^2-xy)]D_2 \qquad (5b)$$

by (1a) we get $$D_0 = c_1 + c_2 = \left[\frac{x+y}{xy}\right]D_1 + \left[\frac{-1}{xy}\right]D_2. \qquad (6)$$

So $$xyD_0 = (x+y)D_1 - D_2. \qquad (7)$$

Since x is on the unit circle, $1/x = x^*$, the complex conjugate of x. Taking conjugates of (7) gives $$xy(D_2)^* = (x+y)(D_1)^* - (D_0)^*. \qquad (8)$$

Solving for a in both (7) and (8) yields $$\frac{yD_1 - D_2}{yD_0 - D_1} = \frac{y(D_1)^* - (D_0)^*}{y(D_2)^* - (D_1)^*} \qquad (9)$$

provided $y \neq D_1/D_0$.

Expanding and combining gives $$[D_1(D_2)^* - (D_1^*D_0)]y^2 + [D_0(D_0)^* - D_2(D_2)^*]y + \qquad (10)$$

$$[D_2(D_1)^* - (D_0)^*D_1] = 0.$$

Set
$$A = D_1(D_2)^* - (D_1)^*D_0 \qquad (11a)$$
$$B = D_0(D_0)^* - D_2(D_2)^* = |D_0|^2 - |D_2|^2 \qquad (11b)$$
$$C = A^* = D_2(D_1)^* - (D_0)^*D_1. \qquad (11c)$$
Therefore $$e^{-j\theta_2} = y = \frac{B \pm (B^2 - 4|A|^2)^{\frac{1}{2}}}{2A} \qquad (12)$$

provided $A \neq 0$.
But (7) and (8) are symmetric in x and y.
So by a similar computation $$e^{j\theta_1} = x = \frac{-B \pm (B^2 - 4|A|^2)^{\frac{1}{2}}}{2A} \qquad (13)$$

provided $A \neq 0$.
But since $x \neq y$ we conclude after
checking in system (7) that $$\theta_1 = \left\{\ln\left[\frac{-B - (B^2 - 4|A|^2)^{\frac{1}{2}}}{2A}\right]\right\} = 2\pi f_1 \tau \qquad (14a)$$

and $$\theta_2 = \left\{\ln\left[\frac{-B + (B^2 - 4|A|^2)^{\frac{1}{2}}}{2A}\right]\right\} = 2\pi f_2 \tau \qquad (14b)$$

appear to agree with Prony's-at least to fifteen decimal places. But there are still two cases for which we have not obtained a solution; namely $Y = D_1/D_0$ and $A = 0$. The first of these is not really a possibility. In fact, it is easy to show that, for nonzero D's, $y = D_1/D_0$ only if $x = y$.

If $A = 0$, then it is not difficult to show that if D's are nonzero then solutions to system (1) are given by $$x = \frac{D_2}{D_1} - \left[\frac{D_2^2}{D_1^2} - \frac{D_2}{D_0}\right]^{\frac{1}{2}} \qquad (15a)$$

and $$y = \frac{D_2}{D_1} + \left[\frac{D_2^2}{D_1^2} - \frac{D_2}{D_0}\right]^{\frac{1}{2}}. \qquad (15b)$$

Degenerate spectra—when one or more of the D's is zero—are more or less trivial.

It is understood that certain modifications to the invention as described may be made, as might occur to one with skill in the field of the invention, within the scope of the appended claims. Therefore, all embodiments contemplated hereunder which achieve the objects of the present invention have not been shown in complete detail. Other embodiments may be developed without departing from the scope of the appended claims.

What is claimed is:

1. A frequency measurement receiver system capable of resolving two signal frequencies appearing on an RF input line within a same measurement interval, comprising three FFT units, each FFT unit having an input coupled to the RF input line via mixers and analog-to-digital (A/D) converter means to provide complex signals having digital in-phase and quadrature components, the three FFT units having outputs coupled to processor means for determining the signal frequencies, the outputs of first, second and third of the FFT units being designated as complex numbers $D_0$, $D_1$, and $D_2$ respectively;

first delay means providing a delay $\tau$ between the RF input and the mixers for the second of the FFT units, and second delay means providing a delay $2\tau$ between the RF input and the mixers for the third of the FFT units, the A/D converter means for all of the FFT units having the same sampling speed $f_s$;

wherein the processor means includes means effective in response to two folding signal frequencies $f_1$ and $f_2$ that fold into one frequency bin, with $\theta_1 = 2\pi f_1 \tau$ and $\theta_2 = 2\pi F_2 \tau$, to determine the frequencies from the equations $$\theta_1 = \left\{\ln\left[\frac{-B - (B^2 - 4|A|^2)^{\frac{1}{2}}}{2A}\right]\right\} \text{ and}$$

$$\theta_2 = \left\{\ln\left[\frac{-B + (B^2 - 4|A|^2)^{\frac{1}{2}}}{2A}\right]\right\}$$

when $A \neq 0$, where
$A = D_1(D_2)^* - (D_1)^*D_0$, and
$B = D_0(D_0)^* - D_2(D_2)^* = |D_0|^2 - |D_2|^2$.

2. A frequency measurement receiver system according to claim 1, wherein the processor means includes means effective in response to two folding signal frequencies $f_1$ and $f_2$ that fold into one frequency bin when $A = 0$ to determine the frequencies from the equations $$x = \frac{D_2}{D_1} - \left[ \frac{D_2^2}{D_1^2} - \frac{D_2}{D_0} \right]^{\frac{1}{2}}$$

and $$y = \frac{D_2}{D_1} + \left[ \frac{D_2^2}{D_1^2} - \frac{D_2}{D_0} \right]^{\frac{1}{2}};$$

where $x = e^{-j\theta_1}$ and $y = e^{-j\theta_2}$ and assuming that $x \neq y$.

* * * * *